(12) United States Patent
Lundberg et al.

(10) Patent No.: US 7,417,465 B2
(45) Date of Patent: Aug. 26, 2008

(54) N-DOMINO OUTPUT LATCH

(75) Inventors: James R. Lundberg, Austin, TX (US); Raymond A. Bertram, Austin, TX (US)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/251,517

(22) Filed: Oct. 14, 2005

(65) Prior Publication Data

US 2006/0033534 A1    Feb. 16, 2006

Related U.S. Application Data

(63) Continuation-in-part of application No. 10/640,369, filed on Aug. 13, 2003, now Pat. No. 7,193,445, and a continuation-in-part of application No. 11/023,145, filed on Dec. 27, 2004, now Pat. No. 7,187,209.

(60) Provisional application No. 60/620,478, filed on Oct. 20, 2004, provisional application No. 60/620,477, filed on Oct. 20, 2004, provisional application No. 60/553,805, filed on Mar. 17, 2004, provisional application No. 60/402,962, filed on Aug. 14, 2002.

(51) Int. Cl.
*H03K 19/096* (2006.01)
*H03K 19/20* (2006.01)

(52) U.S. Cl. .......................... 326/95; 326/121

(58) Field of Classification Search ................ 326/83, 326/93, 95, 98, 121; 365/203
See application file for complete search history.

(56) References Cited

U.S. PATENT DOCUMENTS

| | | | |
|---|---|---|---|
| 5,075,386 A | 12/1991 | Vanderbilt | |
| 5,889,979 A | 3/1999 | Miller, Jr. et al. | |
| 5,926,038 A | 7/1999 | Fouts et al. | |
| 6,191,618 B1 | 2/2001 | Gayles et al. | |
| 6,265,899 B1 | 7/2001 | Abdel-Hafeez et al. | |
| 6,496,038 B1 * | 12/2002 | Sprague et al. | ............... 326/95 |
| 6,560,737 B1 | 5/2003 | Colon-Bonet et al. | |
| 6,628,143 B2 | 9/2003 | Hsu et al. | |
| 6,650,145 B2 | 11/2003 | Ngo et al. | |
| 2002/0158670 A1 | 10/2002 | Alvandpour | |
| 2003/0042932 A1 | 3/2003 | Bales | |
| 2003/0052714 A1 | 3/2003 | Alvandpour | |
| 2003/0110404 A1 | 6/2003 | Seningen et al. | |
| 2004/0257115 A1 | 12/2004 | Bertram et al. | |
| 2005/0046446 A1 | 3/2005 | Qureshi et al. | |
| 2005/0110522 A1 | 5/2005 | Hoekstra | |

\* cited by examiner

*Primary Examiner*—Daniel D Chang
(74) *Attorney, Agent, or Firm*—Richard K. Huffman; James W. Huffman

(57) ABSTRACT

An N-domino latch includes a domino stage, a write stage, an inverter, a high keeper path, a low keeper path, and an output stage. The domino stage is coupled to an approximately symmetric clock signal. The domino stage evaluates a logic function according to the states of at least one data signal and the approximately symmetric clock signal, where the domino stage pre-charges a pre-charged node high when the approximately symmetric clock signal is low, and discharges the pre-charged node to a low state if the logic function evaluates when the approximately symmetric clock signal is high, and keeps the pre-charged node high if the logic function fails to evaluate when the approximately symmetric clock signal is high, where a latching state of the at least one data signal is provided to the domino stage when the approximately symmetric clock signal is high.

27 Claims, 10 Drawing Sheets

N-DOMINO OUTPUT LATCH

CROSS-REFERENCE TO RELATED APPLICATIONS

This application claims the benefit of U.S. Provisional Application Ser. No. 60/620,478, filed on Oct. 20, 2004, which is herein incorporated by reference for all intents and purposes.

This application claims the benefit of U.S. Provisional Application Ser. No. 60/620,477, filed on Oct. 20, 2004, which is herein incorporated by reference for all intents and purposes.

This application is a continuation-in-part of the following U.S. Patent Applications, each of which has a common assignee and at least one common inventor, and which each of which is herein incorporated by reference in its entirety for all intents and purposes:

| SERIAL NUMBER | FILING DATE | TITLE |
| --- | --- | --- |
| 10/640369 now U.S. Pat. No. 7,193,445 | Aug. 13, 2003 | NON-INVERTING DOMINO REGISTER |
| 11/023145 now U.S. Pat. No. 7,187,209 | Dec. 27, 2004 | NON-INVERTING DOMINO REGISTER |

Co-pending U.S. patent application Ser. No. 10/640,360 claims the benefit of U.S. Provisional Application Ser. No. 60/402,962 filed on Aug. 14, 2002 and co-pending U.S. patent application Ser. No. 11/023,145 claims the benefit of U.S. Provisional Application Ser. No. 60/553,805 filed on Mar. 17, 2004.

This application is related to the following U.S. Patent Applications, each having a common assignee and common inventors.

| SERIAL NUMBER | FILING DATE | TITLE |
| --- | --- | --- |
| 11/251,399 | Oct. 14, 2005 | P-DOMINO OUTPUT LATCH |
| 11/251,384 | Oct. 14, 2005 | P-DOMINO REGISTER |

BACKGROUND OF THE INVENTION

1. Field of the Invention

The present invention relates to dynamic logic and register functions, and more particularly to a domino output latch that addresses the problem of latching the outputs of complex logic circuits where speed and size are important factors.

2. Description of the Related Art

Integrated circuits use a remarkable number of registers, particularly those having a synchronous pipeline architecture. Register logic is employed to hold the outputs of devices and circuits for a period of time so that these outputs can be received by other devices and circuits. In a clocked system, such as a pipeline microprocessor, registers are used to latch and hold the outputs of a given pipeline stage for a period of one clock cycle so that input circuits in a subsequent stage can receive the outputs during that period while the given pipeline stage is concurrently generating new outputs.

In the past, it has been common practice to precede and follow complex logical evaluation circuits, such as multiple input multiplexers (muxes), multi-bit encoders, etc., with registers to hold the inputs to and the outputs from the evaluation circuits. Generally, these registers have associated setup and hold time requirements, both of which constrain the evaluation circuits in the preceding stage. In addition, registers have corresponding data-to-output time characteristics, which constrain the evaluation circuits in subsequent stages. The "speed" of a register is typically judged in terms of its data-to-output time, that is, the sum of its setup time and clock-to-output time.

Preceding and following a logical evaluation circuit with traditional register circuits introduces delays into a pipeline system whose cumulative effect results in significantly slower operating speeds. More specifically, one notable source of these delays is the data-to-output time requirements that must be satisfied by logical evaluation circuits in order to ensure stable registered outputs. It is desired to reduce these delays to provide additional time in each stage and to thereby increase overall speed of the pipeline system.

A prior and related disclosure, entitled "Non-inverting Domino Register", which is incorporated by reference herein, addressed the problems described above. In the prior disclosure, a non-inverting domino register was described which combined logic evaluation functions with their corresponding registers to achieve a faster clock-to-output time than conventional approaches without compromising the stability of its output. The transitions of the output signal of the non-inverting domino register disclosed therein were shown to be very fast in response to transitions of the clock signal in contrast to the slower transition responses of conventional inverting domino registers. The prior non-inverting domino register, however, was not particularly flexible with respect to the evaluation logic, which had to be provided as N-channel logic. Also, the prior non-inverting domino register could potentially experience leakage effects when embodied in a high leakage or high noise process, such as, for example, 90-nanometer (nm) silicon-on-insulator (SOI).

It is desired to provide an improved domino register that provides all of the benefits of the prior non-inverting domino register, and that is further flexible with regard to the domino stage and that is optimum for use in a high leakage or high noise environment.

It is furthermore desired to provide an improved N-domino output latch that provides all of the benefits of the prior non-inverting domino register when used as a latch, and that is further flexible with regard to the domino stage and that is optimum for use in a high leakage or high noise environment.

It is moreover desired to provide an improved P-domino circuit that, when employed as a latch, provides all of the benefits of the prior non-inverting domino register, and that is optimized for use in a high leakage or high noise environment.

It is additionally desired to provide an improved P-domino circuit that, when employed as a latch, provides all of the benefits of the prior non-inverting domino register, and that is optimized for use in a high leakage or high noise environment.

SUMMARY OF THE INVENTION

In one embodiment, an N-domino latch is provided. The N-domino latch includes a domino stage, a write stage, an inverter, a high keeper path, a low keeper path, and an output stage. The domino stage is coupled to an approximately symmetric clock signal. The domino stage evaluates a logic function according to the states of at least one data signal and the approximately symmetric clock signal, where the domino stage pre-charges a pre-charged node high when the approximately symmetric clock signal is low, and discharges the pre-charged node to a low state if the logic function evaluates when the approximately symmetric clock signal is high, and keeps the pre-charged node high if the logic function fails to evaluate when the approximately symmetric clock signal is high, where a latching state of the at least one data signal is provided to the domino stage when the approximately symmetric clock signal is high. The write stage is coupled to the domino stage and is responsive to the approximately symmetric clock signal, which pulls a first preliminary output node high if the pre-charged node goes low and which pulls the first preliminary output node low if the pre-charged node stays high. The inverter has an input coupled to the first preliminary output node and an output coupled to a second preliminary output node. The high keeper path keeps the first preliminary output node high when enabled, where the higher keeper path is enabled when the approximately symmetric clock signal and the second preliminary output node are both low, and is otherwise disabled. The low keeper path keeps the first preliminary output node low when enabled, where the low keeper path is enabled when the second preliminary output node and the pre-charged node are both high, and is otherwise disabled. The output stage provides an output signal based on states of the pre-charged node and the second preliminary output node.

In another embodiment, an N-domino latching circuit is provided. The N-domino latching circuit has an evaluation circuit, a write circuit, an inverter, a keeper circuit, and an output circuit. The evaluation circuit receives a symmetric clock signal provided from a source therefrom, and pre-charges a first node high while said symmetric clock signal is low, and evaluates a logic function to control a state of the first node when the symmetric clock signal goes high, where the logic function is evaluated based upon one or more data signals that are to be evaluated when the symmetric clock signal is high and that are to be latched when the symmetric clock signal is low. The write circuit is coupled to the first node and receives the symmetric clock signal. The write circuit drives a second node high if the first node is low and drives the second node low if the first node stays high when the symmetric clock signal goes high. The inverter has an input coupled to the second node and an output coupled to a third node. The keeper circuit is coupled to the second and third nodes and the write circuit. The keeper circuit keeps the second node high while the third node and symmetric clock signals are both low and keeps the second node low while the third node and first node are both high. The output circuit provides an output signal based on states of the first and third nodes.

In a further embodiment, a non-inverting N-domino latch includes a first P-channel device, a first N-channel device, evaluation logic, a write stage, a keeper circuit, and an output stage. The first P-channel device has a gate coupled to an approximately symmetric clock signal and a drain and source coupled between a source voltage and a pre-charged node. The first N-channel device has a gate receiving the approximately symmetric clock signal, a drain coupled to said pre-charged node and a source. The evaluation logic is coupled between the source of the N-channel device and ground and comprises complementary metal-oxide semiconductor logic that evaluates a logic function based on at least one input data signal, where the at least one input data signal is to be evaluated when the approximately symmetric clock signal is high and is to be latched when the approximately symmetric clock signal goes low. The write stage drives a first preliminary output node. The write stage includes a first pull-up device and a first pull-down device both responsive to the pre-charged node, and a second pull-down device responsive to the approximately symmetric clock signal. The keeper circuit has an input coupled to the first preliminary output node and an output that drives a second preliminary output node. The output stage drives an output node. The output stage includes a second pull-up device and a third pull-down device both responsive to the pre-charged node and a third pull-up device and a fourth pull-down device both responsive to the second preliminary output node.

In yet another embodiment, a method of latching one or more input data signals is provided. The method includes pre-charging a first node high while an approximately symmetric clock signal is low; when the approximately symmetric clock signal is high, evaluating a logic function based upon the one or more input data signals to control the state of the first node; controlling the state of a second node with the state of the first node when the approximately symmetric clock signal is high; defining the state of a third node as the inverted state of the second node; enabling a low state keeper path to keep the state of the second node low when the first and third nodes are both high and otherwise disabling the low state keeper path; enabling a high state keeper path to keep the state of the second node high when the approximately symmetric clock signal and the third node are both low and otherwise disabling the high state keeper path; and when the approximately symmetric clock signal is low, latching the state of an output node based on the states of the first and third nodes.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for providing latched and/or registered outputs for logic circuits in which speed, size and stability are critical factors, which is flexible with regard to the evaluation logic, and which may be used in high leakage or high noise environments. He has therefore developed a non-inverting domino register and associated N-domino and P-domino latches that have a faster data-to-output time without compromising the stability of the output, that is flexible with regard to the evaluation logic implementation, and that may be used in a high leakage or high noise environment, as will be further described below with respect to FIGS. 1-5. When employed in a pipeline architecture that relies heavily on registers and domino logic to transfer data from stage to stage, a non-inverting domino register or domino latch according to embodiments of the present invention enables overall device operating speed to be significantly increased. The overall device may be implemented using faster and smaller devices in a high leakage or high noise process without compromising speed and without requiring large devices to overcome keeper devices.

Figure 1:
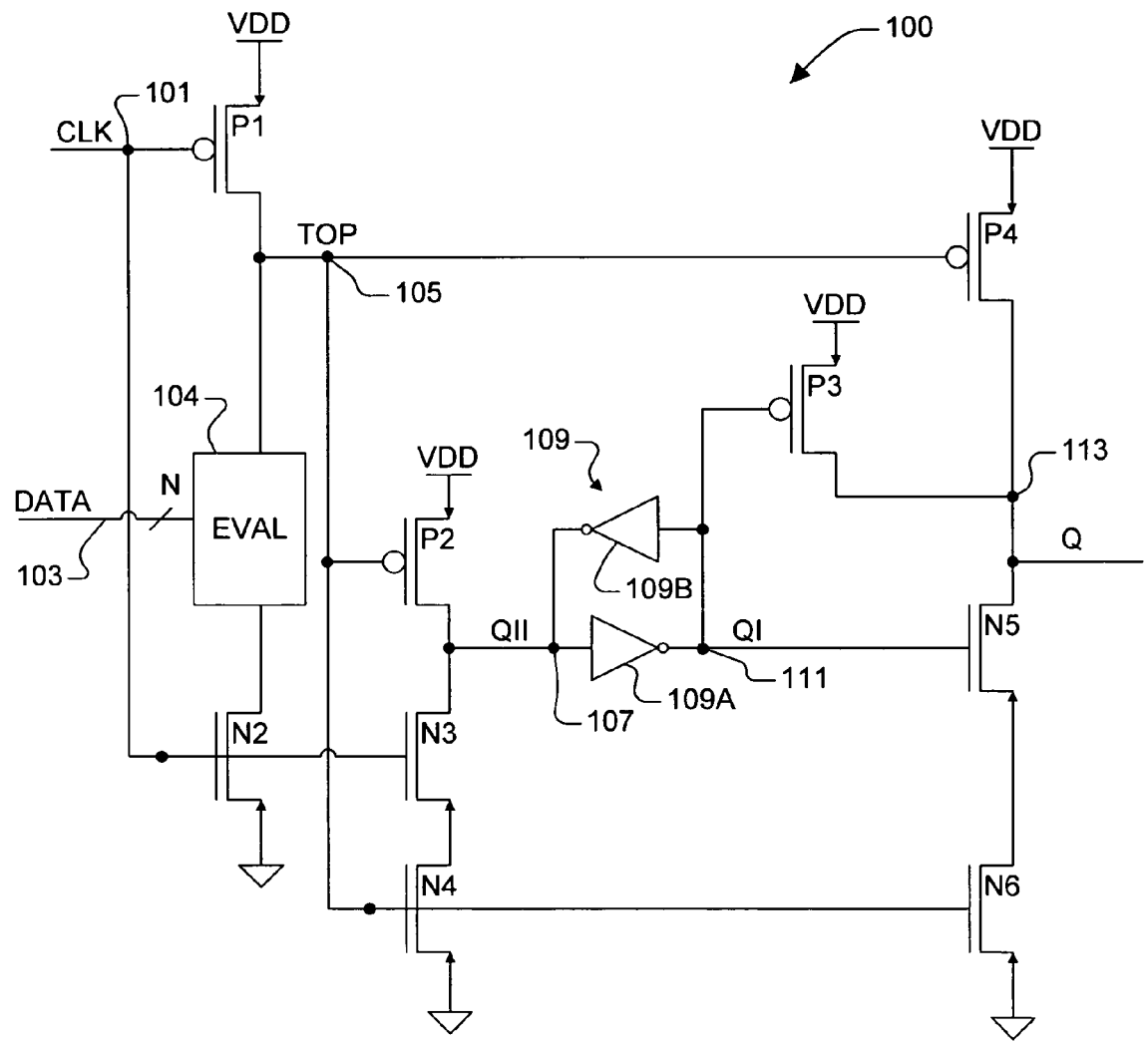
FIG. 1 is a schematic diagram of a non-inverting domino register implemented according to a prior disclosure which is incorporated by reference.

FIG. 1 is a schematic diagram of a non-inverting domino register 100 implemented according to the prior disclosure CNTR.2200. The non-inverting domino register 100 includes a logic evaluation input stage, or domino stage, which consists of stacked P-channel and N-channel devices P1 and N2 and evaluation logic 104. The P1 and N2 devices are a complementary pair of evaluation devices coupled on either side of evaluation logic 104 in the stack. The evaluation logic 104 may be as simple as a single N-channel device or may be significantly more complex for evaluation any desired logic function. The source of P1 is coupled to a voltage source VDD and its drain is coupled to node 105 providing a signal TOP. The evaluation logic 104 is coupled between node 105 and the drain of N2, having its source coupled to ground. An input clock signal CLK is provided via node 101 to the gates of P1 and N2. A set of N nodes 103 provide N input data signals DATA to the evaluation logic 104, where N is any positive integer.

The domino stage of the non-inverting domino register 100 is followed by a storage stage which includes devices P2, N3 and N4 and a weak keeper circuit 109. The devices P2, N3 and N4 may be considered as a "write stage" and the keeper circuit 109 as a keeper stage within the storage stage. Node 101 is coupled to the gate of N3 and node 105 is coupled to the gates of P2 and N4. The source of P2 is coupled to VDD and its drain is coupled to a first intermediate output node 107 providing a first intermediate output signal QII. Node 107 is coupled to the drain of N3, to the input of an inverter 109A and to the output of another inverter 109B. The output of the inverter 109A is coupled to a second intermediate output node 111 providing a second intermediate output signal QI, which is coupled to the input of the inverter 109B. The inverters 109A and 109B are cross-coupled between nodes 107 and 111 and collectively form the weak keeper circuit 109. The source of N3 is coupled to the drain of N4, which has its source coupled to ground.

The storage stage of the non-inverting domino register 100 is followed by an additional output stage, which includes P-channel devices P3 and P4 and N-channel devices N5 and N6. Node 105 is coupled to the gates of P4 and N6, and node 111 is coupled to the gates of P3 and N5. The sources of P3 and P4 are coupled to VDD and their drains are coupled together at an output node 113 providing an output signal Q. Output node 113 is coupled to the drain of N5, which has its source coupled to the drain of N6, which has its source coupled to ground. The P-channel devices generally operate as pull-up devices and the N-channel devices generally operate as pull-down devices.

Figure 2:
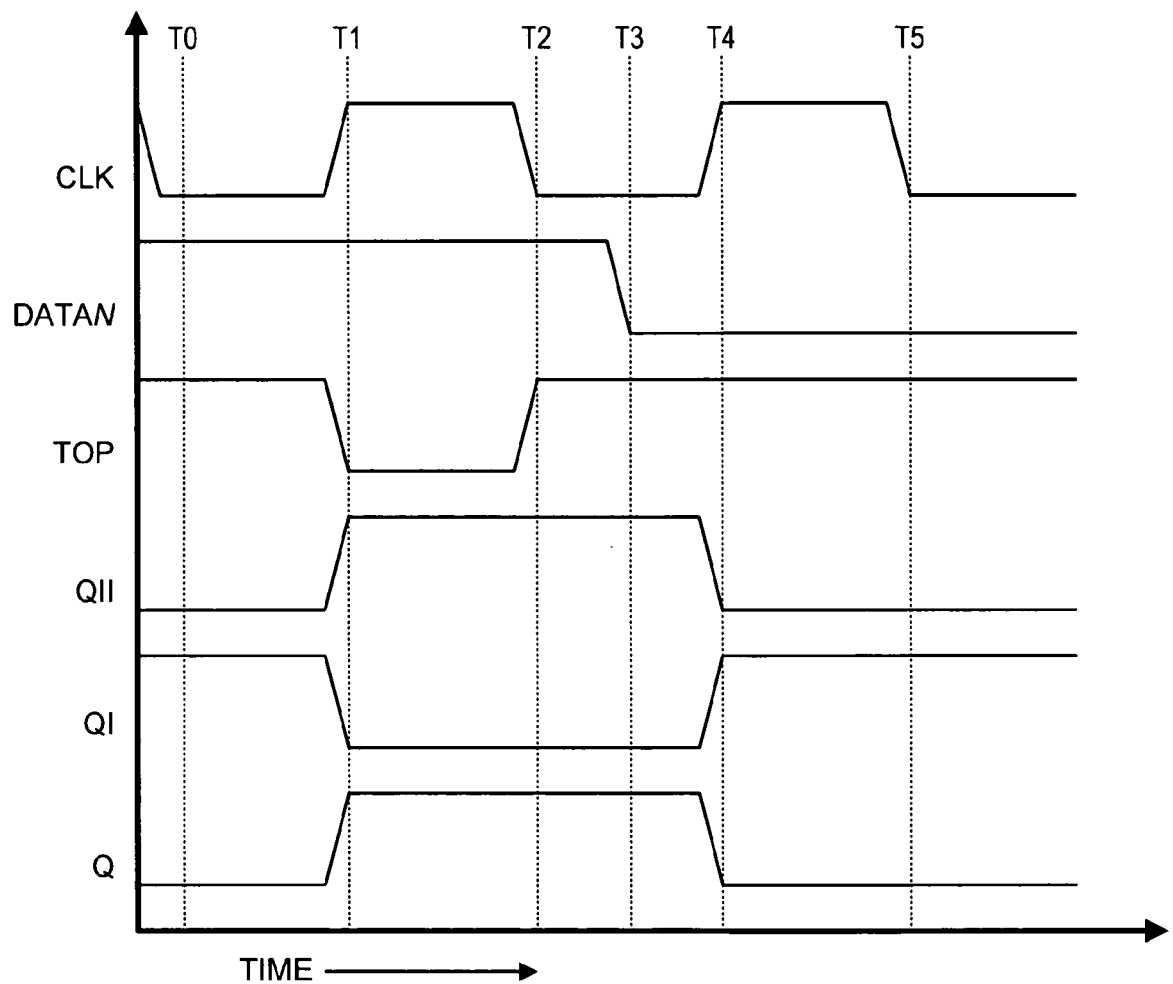
FIG. 2 is a timing diagram illustrating operation of the non-inverting domino register of FIGS. 1, 3, 4 and 5.

FIG. 2 is a timing diagram illustrating operation of the non-inverting domino register 100, in which the CLK, DATAN, TOP, QII, QI and Q signals are plotted versus time. The relative transitions times are estimated and delays are ignored. The DATAN signal is shown as a single signal representing the collective set of N DATA signals. The DATAN signal is shown asserted high for when the collective state of the data signals causes the evaluation logic 104 to evaluate thereby pulling the TOP signal low, and is shown asserted low for when the evaluation logic 104 fails to evaluate, which keeps the TOP signal high. Thus, when the evaluation logic 104 "evaluates," it causes signal TOP to transition from its pre-charged high state to a low state. When the evaluation logic "fails to evaluate," TOP remains at its pre-charged high state. At time T0 when the CLK signal is initially low, N2 is turned off and P1 is turned on, so that the domino stage pre-charges the TOP signal high. The TOP signal is pre-charged high in preparation for evaluation of the DATAN signal by the evaluation logic 104 upon the rising edge of CLK, where the DATAN signal is initially high. The pre-charged TOP signal turns on N4 and N6. The QII signal remains at its former state (shown initially in a low logic state) and is held there by the keeper circuit 109. The QI signal is initially high turning on N5, so that the Q output signal is initially pulled low via the N5 and N6 devices.

At time T1 the CLK signal goes high, which causes the TOP signal to discharge low since the DATAN signal is high. In particular, N2 is turned on and the evaluation logic 104 evaluates pulling TOP low via N2 to ground. The QII signal is pulled high via P2 and the Q output signal is pulled high via P4. The QII and Q signals are both pulled high at about the same time T1, and the QI signal is pulled low by the inverter 109A. The inverted state of the QI signal at the output of the keeper circuit 109 drives the devices P3 and N5. When QI is high, P3 is off and N5 is on; and when QI is low, P3 is on and N5 is off. At subsequent time T2 when the CLK signal next goes low, the TOP signal is once again pre-charged high. P2 and N3 are turned off so that node 107 is not driven to either state. The respective states of the QII and QI signals remain unchanged, however, via operation of the keeper circuit 109, so that the Q and QII signals remain high and the QI signal remains low throughout the remainder of the half cycle of CLK.

The DATAN is shown going low at time T3 while the CLK signal is still low, and the CLK signal is next asserted high at time T4 while the DATAN signal is low. The evaluation logic 104 fails to evaluate, so that TOP remains high while DATAN is low and CLK is high. The CLK and TOP signals turn on devices N3 and N4, respectively, so that the QII signal is asserted low at about time T4, and the QI signal is consequently pulled high by the inverter 109A. The TOP signal being high keeps N6 on. The QI signal turns N5 on and P3 off, so that the Q signal is pulled low via N5 and N6. The CLK signal next goes low at time T5 pulling TOP high again. The respective states of the QII and QI signals remain unchanged via operation of the keeper circuit 109. The Q signal remains low throughout the remainder of the cycle of CLK since QI keeps N5 on and TOP keeps N6 on.

The Q signal transitions from low to high relatively quickly in response to a rising edge of the CLK signal when the evaluation logic 104 evaluates discharging the TOP signal low. There is a negligible delay through devices N2 and P4 causing the output transition. The Q signal transitions from high to low after a negligible delay through devices N3, N5 and the inverter 109A in response to a rising edge of the CLK signal when the evaluation logic 104 fails to evaluate leaving the TOP signal high. The delay through the inverter 109A is minimized by being implemented as a relatively small device (with minimal capacitance) since it does not need to have the size nor perform the function of a buffer. In another embodiment, the delay can be minimized by employing ratioed logic (i.e., large P device and small N device) for the inverter 109A. It is appreciated by those of ordinary skill in the art that transitions of the output Q signal of the non-inverting domino register 100 are very fast in response to transitions of the CLK signal. If a non-inverting output is necessary or otherwise desired, the non-inverting domino register 100 provides superior data-to-output speed compared to conventional designs among other benefits and advantages. The non-inverting domino register 100 may be converted to an inverting domino register simply by adding an output inverter/buffer (not shown).

As operation of the circuit 100 of FIG. 1 has been described, one skilled in the art will appreciate that since the function of the evaluation logic 104 is to rapidly transition signal TOP from its pre-charged high level to a low level, one embodiment of the present invention employs ratioed P and N devices to configure the evaluation logic. In this embodiment, strong N devices and weak P devices are employed, resulting in faster operation.

The prior disclosure CNTR.2200 illustrated exemplary AND logic and OR logic (not shown herein) which may be used as the evaluation logic 104. It was described therein that any suitable combination of the AND and OR logic circuits are contemplated, and that any other complex logical evaluation circuit are contemplated, including, for example, multiple input multiplexers (muxes), multi-bit encoders, etc. Any desired simple to complex evaluation logic can be substituted for the evaluation logic 104 without adversely impacting the speed or associated power constraints of the non-inverting domino register 100. The AND and OR logic circuits were exemplary only and were provided to illustrate that the evaluation logic 104 may be any complex logical evaluation circuit as appreciated by those having ordinary skill in the art. A possible limitation of the inverting domino register 100, however, is that it is not particularly flexible with respect to the evaluation logic 104, which typically had to be implemented as N-channel logic. N-channel logic does not provide the optimal levels of input noise margin.

Figure 3:
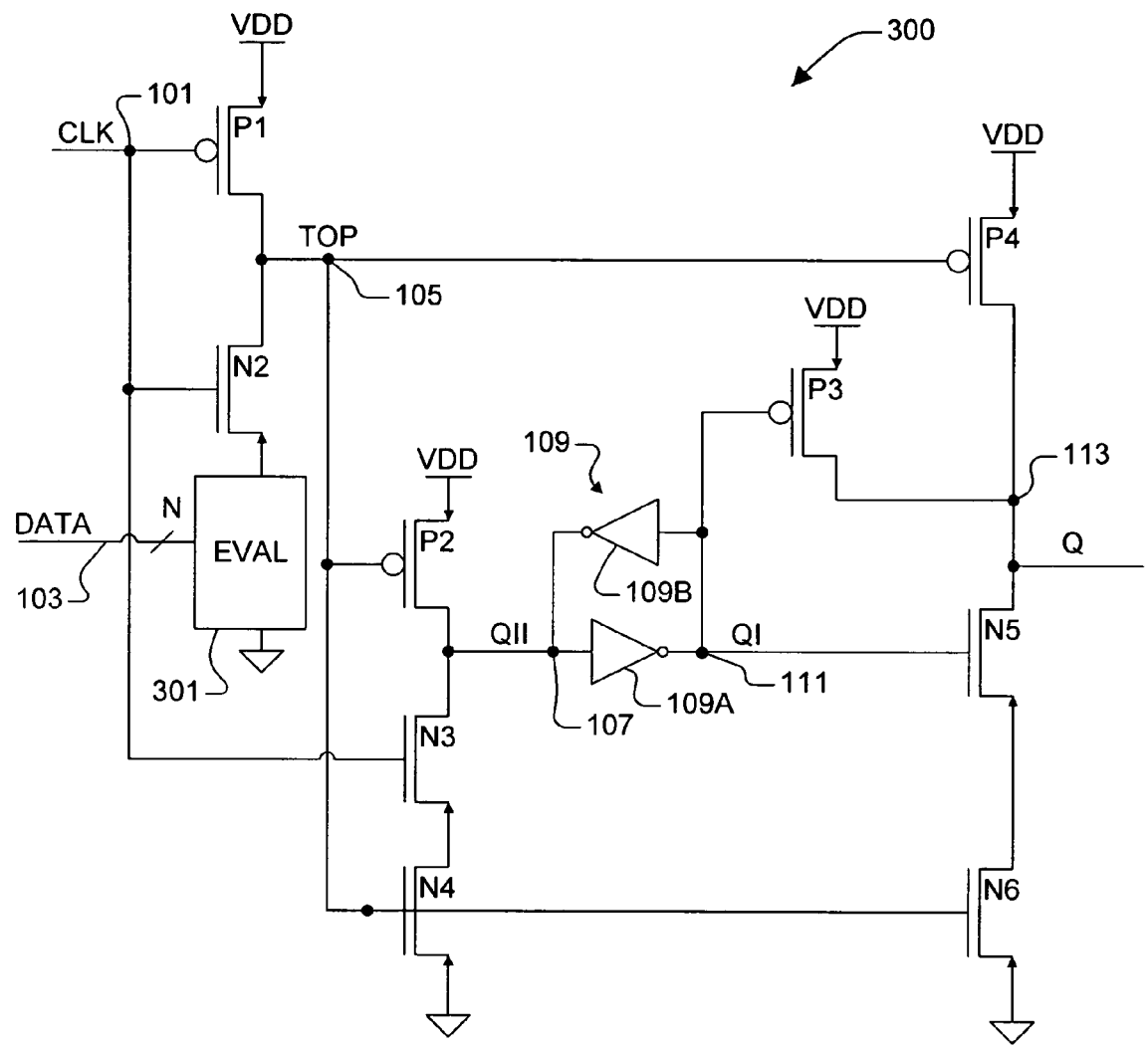
FIG. 3 is a schematic diagram of a footless non-inverting domino register implemented according to an exemplary embodiment of the present invention.

FIG. 3 is a schematic diagram of another non-inverting domino register 300 implemented according to an exemplary embodiment of the present invention. The non-inverting domino register 300 is substantially similar to the non-inverting domino register 100 except that the logic evaluation input stage, or domino stage, comprising the stacked P-channel and N-channel devices P1 and N2 and evaluation logic 104, is reordered into a "footless" configuration and the evaluation logic 104 is replaced with evaluation logic 301. The P1 and N2 devices are a complementary pair of evaluation devices coupled together at the node 105 providing the TOP signal. In this case, the drain of N2 is coupled to node 105 and its source is coupled to the top or upper end of the evaluation logic 301. The lower or bottom end of the evaluation logic 301 is coupled to ground. In this manner, the evaluation logic 301 is located at the foot of the P1/N2 stack as opposed to being coupled between P1 and N2. Operation is substantially similar and the timing diagram of FIG. 2 remains equally valid for the non-inverting domino register 300.

The evaluation logic 301 could be configured in substantially the same manner as the evaluation logic 104. As understood by those skilled in the art, however, the evaluation logic 301 may alternatively be embodied using complementary metal-oxide semiconductor (CMOS) logic rather than N-channel logic, where again, the timing diagram of FIG. 2 remains valid. CMOS logic provides significantly better input level noise margin over N-channel logic so that the non-inverting domino register 300 provides significantly better input level noise margin over the non-inverting domino register 100 when using CMOS logic in the domino stage.

The non-inverting domino registers 100 and 300 both experience leakage effects when embodied in a high leakage or high noise process, such as 90 nm SOI and the like. Scaling circuits down to 90 nm introduces issues related to leakage. Scaled processes exhibit higher leakage because channel lengths are shorter. Consequently, in order to write a new state to node 107 of the storage stage for either of the registers 100 and 300, a weak device must be overcome within the feedback inverter (e.g., within the inverter 109B, a weak P-channel device to change to a low state and a weak N-channel device to change to a high state). The cost of overcoming a device is speed and current. In addition, in processes in which there is either high leakage or high noise, the weak N and P devices within the feedback inverter 109B must be made larger in order to maintain the state of the output node in the presence of leakage or noise.

Note, for example, that the storage node 107 (signal QII) is isolated from the input stage when CLK is low. There is nothing driving the QII signal except the keeper feedback inverter 109B, which includes internal weak N and P devices (not shown). Yet, because of increased leakage associated with a scaled process, a larger amount of leakage current flows through the P2 and N3 devices. So, the N and P devices in the inverter 109B have to be large enough to overcome that leakage. For instance, if the QII signal is high, leakage occurs to ground through the N3 and N4 devices, so that the P device within the inverter 109B has to be large enough to supply enough current to overcome that leakage to keep the QII signal high. In processes in which there is high leakage or high currents and the devices are off, wider and wider devices are needed to hold state. And the use of wider devices substantially reduces performance because when a new state is written, the wider device that is keeping the state must be overcome. To compensate for the reduction in speed, the storage stage devices P2, N3, and N4 are made larger to drive the new state to overcome that held by the large devices in the keeper feedback inverter 109B. Larger devices consume valuable space on an integrated circuit (IC).

Figure 4:
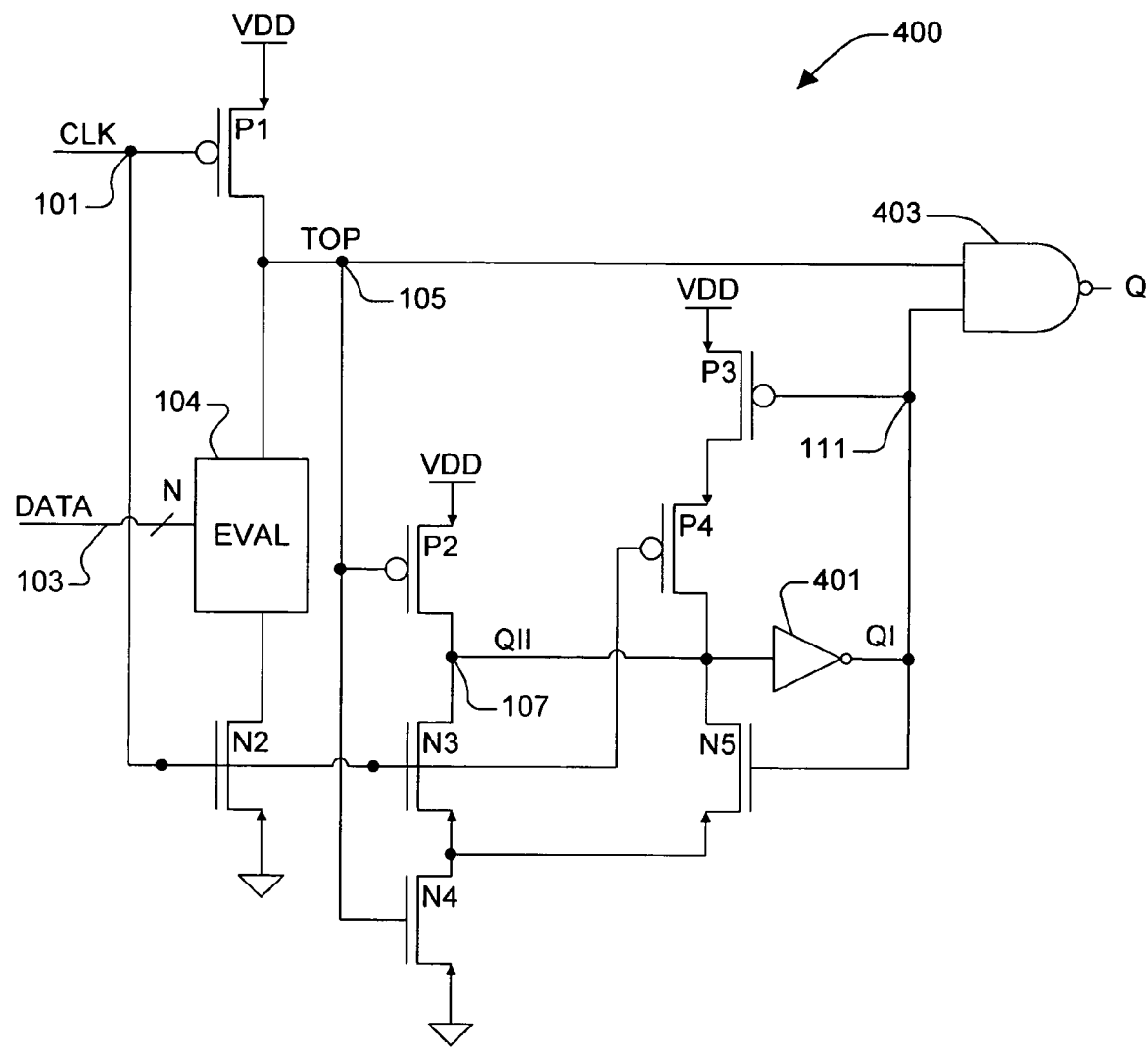
FIG. 4 is a schematic diagram of another non-inverting domino register implemented according to an exemplary embodiment of the present invention employing an improved storage stage.

FIG. 4 is a schematic diagram of another non-inverting domino register 400 implemented according to an exemplary embodiment of the present invention employing an improved keeper circuit. The non-inverting domino register 400 includes an input domino stage followed by a storage stage and an output stage. The domino stage and the initial portion of the storage stage of the register 400 are similar to those of the register 100. The keeper circuit of the register 400, however, is modified to improve performance by eliminating the need to overcome devices and reduce cost in terms of speed and current. The domino stage includes stacked P-channel and N-channel devices P1 and N2 and evaluation logic 104. As before, the P1 and N2 devices are a complementary pair of evaluation devices coupled on either side of evaluation logic 104 between the voltage source VDD and ground. The source of P1 is coupled to VDD and its drain is coupled to node 105 providing the TOP signal. The evaluation logic 104 is coupled between node 105 and the drain of N2 and the source of N2 is coupled to ground. The input clock signal CLK is provided via node 101 to the gates of P1, N2 and N3. A set of N nodes 103 provide N input data signals DATA to the evaluation logic 104. As before, the node 105 providing the TOP signal is coupled to the gates of devices P2 and N4. The initial portion of the storage stage is substantially the same write stage including the stacked devices P2, N3 and N4. The source of P2 is coupled to VDD and its drain is coupled to node 107 developing the first intermediate output signal QII. The drain of N3 is coupled to node 107 and its source is coupled to the drain of N4, having its source coupled to ground.

The storage stage of the non-inverting domino register 400 includes the write stage including devices P3, P4, and N5 and a keeper stage including devices P3, P4, N3 and an inverter 401. The storage stage is followed by an output stage, which comprises a two-input NAND gate 403 in the embodiment illustrated. In this case, the source of P3 is coupled to VDD and its drain is coupled to the source of P4, having its drain coupled to the drain of N5 at the node 107. The source of N5 is coupled to the drain of N4 further coupled to the source of N3. Node 101, providing the CLK signal, is coupled to the gate of P4. Node 107, developing the QII signal, is coupled to the input of the inverter 401, having its output coupled to node 111 developing the second intermediate output signal QI. Node 111 is coupled to the gates of P3 and N5 and is coupled to one input of the NAND gate 403. Node 105, providing the TOP signal, is coupled to the other input of the NAND gate 403, and the output the NAND gate 403 provides the output Q signal.

The timing diagram of FIG. 2 is applicable for the non-inverting domino register 400 for this situation with only minor differences in timing, where such timing differences and small delays are ignored (e.g., delays through the inverter 401 and the NAND gate 403 are ignored). Again, suppose that the QII signal is initially low and is to be asserted high. With reference to FIG. 2, at time T0, the CLK, Q and QII signals are initially low and the QI signal is high. Since CLK is low, P1 is turned on and TOP is pre-charged high turning on N4. Since QI and TOP are both high, the Q signal at the output of the NAND gate 403 is initially low. While CLK is low and QI is high, N5 is on, P3 is off, and P4 is on. In this case, therefore, N5 and N4 are both on providing a "low" state keeper path for the node 107 to ground which keeps the QII signal low. The low keeper path is enabled whenever the second preliminary output node 111 and the pre-charged node 105 are both high, and is otherwise disabled.

When the CLK signal goes high at time T1, N2 is turned on initiating evaluation of the DATA operands by the evaluation logic 104. As before, the DATAN signal, representing the input DATA operands, is shown initially high which causes the evaluation logic 104 to couple node 105 to the drain of N2. This causes the TOP signal to be pulled low via N2. TOP going low causes the NAND gate 403 to assert Q high at about time T1 (after a short delay through the NAND gate 403). Also, TOP going low turns off N4 thereby disabling the low keeper path from N5 through N4 down to ground. And TOP going low turns P2 on so that the QII signal is pulled high at about time T1. When the QII signal goes high at time T1, the inverter 301 pulls the QI signal low, which turns P3 on and N5 off. The Q output signal stays low while the QI signal is low.

In this example, the low keeper path through N5 is disabled because N4 is turned off when the TOP signal goes low. And since N4 is turned off, P2 does not have to overcome N5 to pull the QII signal high. Whenever the QII signal is low and is to be pulled high in response to evaluation (pulling TOP low), the low keeper path is always disabled (because N4 is off) so that the write stage of the storage stage does not have to overcome a keeper device.

At time T2 when CLK next goes low, TOP is once again pre-charged high. Also at time T2, P4 is turned on providing a "high" state keeper path from node 107 to VDD via P4 and P3, thereby keeping the QII signal high. The high keeper path is enabled whenever the pre-charged node 105 and the second preliminary output node 111 are both low, and otherwise disabled. Thus, the QII signal is kept high, which in turn keeps QI low to maintain the state of the Q output signal while TOP goes high at time T2. The TOP signal going high turns N4 back on at about time T2, but since the QI signal is low, N5 is off thereby keeping the low keeper path turned off or disabled for the remainder of the cycle.

The DATAN signal goes low at time T3 and the CLK signal next goes high at time T4 while the DATAN signal is still low so that the evaluation logic 104 does not evaluate. Accordingly, TOP remains high at time T4 so that N4 remains turned on. The CLK signal going high turns P4 off and N3 on. The high keeper path from node 107 to VDD is disabled since P4 is turned off, and N3 and N4 are both on pulling the QII signal low. Since P4 is off, N3 and N4 do not have to overcome any devices, including weak keeper devices, to pull QII low. Whenever the QII signal is high and is to be pulled low in response to failure of evaluation (in which TOP stays high), the high keeper path is always disabled (because P4 is off) so that the write stage of the storage stage does not have to overcome a keeper device. The inverter 401 pulls QI high at about time T4 in response to QII going low. Since QI and TOP are both high, the NAND gate 403 pulls Q low at about time T4. Also, QI going high turns N5 on and P3 off, so that the high keeper path is disabled and the low keeper path via N5 and N4 is re-enabled. When CLK next goes low at time T5, N3 is turned off but QII is kept low through the low keeper path since N5 and N4 are kept on. TOP and QI both remain high, so that Q remains low for the remainder of the CLK cycle.

The non-inverting domino register 400 employs an improved technique to disable the weak keeper feedback devices, so that when a new state is being written, a strong device internal to a keeper device does not have to be overcome. Consequently, the P3 and N5 devices are made wider to overcome leakage in order to maintain state, but without affecting speed because those same devices P3 and N5 are disabled when a new state is written to the storage node 107 (the QII signal). When writing a new state of the QII signal, a feedback keeper circuit does not have to be overcome, so that the devices P2 and N3 can be normal-sized devices. The "keeper" of the non-inverting domino register 400 is only enabled to store the state. In particular, the feedback devices are enabled to keep the state and disabled when writing a new state.

Figure 5:
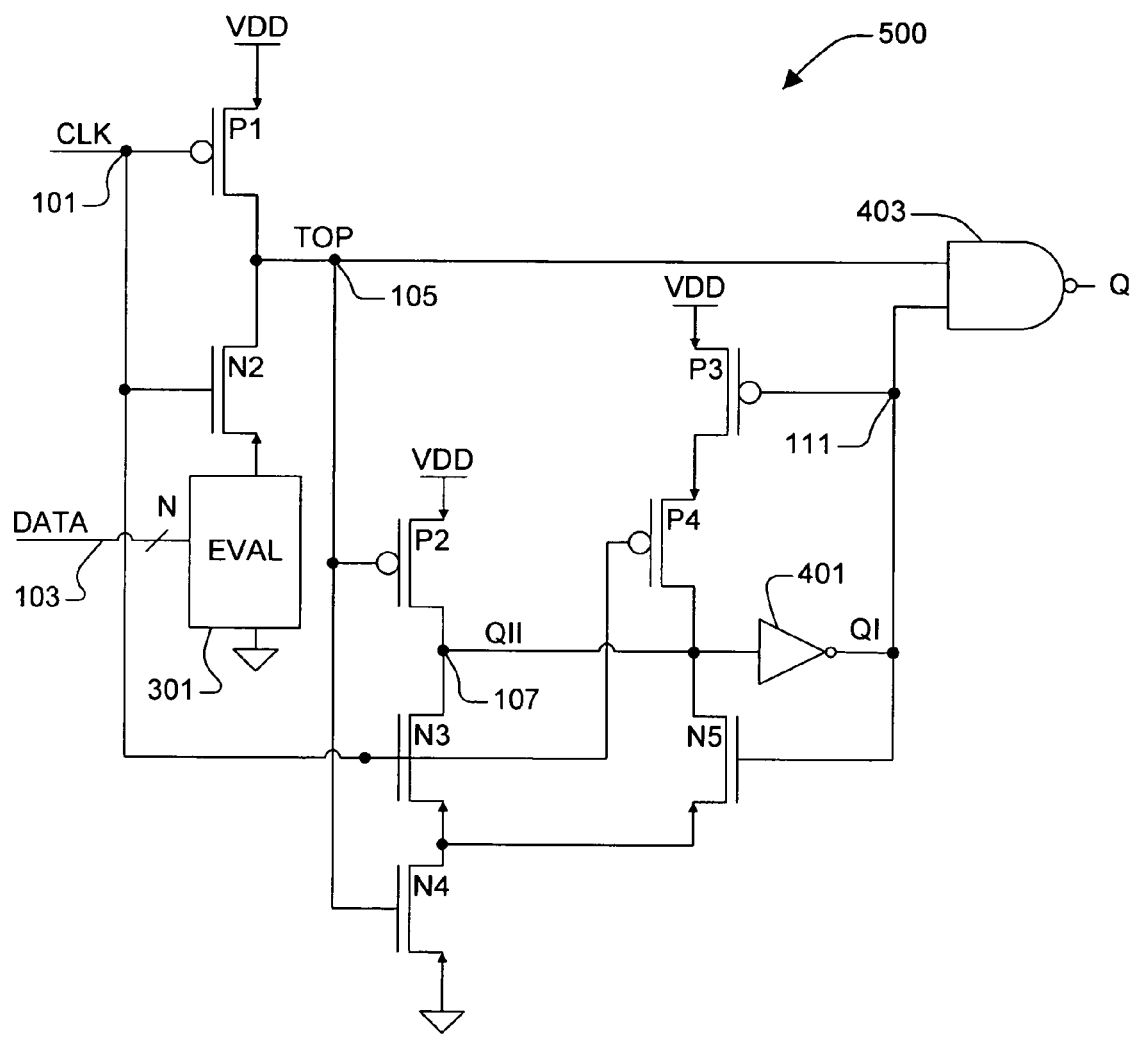
FIG. 5 is a schematic diagram of another footless non-inverting domino register employing the improved storage stage of FIG. 4 and implemented according to an exemplary embodiment of the present invention.

FIG. 5 is a schematic diagram of another footless non-inverting domino register 500 employing the improved keeper stage of the register 400 and implemented according to another exemplary embodiment of the present invention. The non-inverting domino register 500 is substantially similar to the non-inverting domino register 400, except that the logic evaluation input stage, or domino stage, comprising the stacked P-channel and N-channel devices P1 and N2 and evaluation logic 104, is reordered into a "footless" configuration and the evaluation logic 104 is replaced with evaluation logic 301. The change from register 500 from 400 is analogous to the change from register 300 to 100. In this manner, the evaluation logic 301 of the non-inverting domino register 500 may be implemented with CMOS logic rather than N-channel logic, where again, the timing diagram of FIG. 2 remains applicable. As previously described, CMOS logic provides significantly better input level noise margin over N-channel logic so that the non-inverting domino register 500 provides somewhat better input level noise margin over the non-inverting domino register 400 when using CMOS logic in the domino stage.

A non-inverting domino register implemented according to an embodiment of the present invention has a faster clock-to-output time than conventional approaches without compromising the stability of its output, Q. In addition, the storage stage may further be improved to allow for smaller, faster devices to be employed in a high leakage environment than those which would otherwise be required to overcome strong keeper devices. This enables the non-inverting domino register to be embodied in a high leakage or high noise process, such as 90 nm SOI and the like, without causing performance degradation caused by leakage factors. Thus, the benefits of a scaled process, including reduced size, voltage, power consumption, etc., may be attained without causing the performance degradation associated with such scaled processes.

It is noted that operation of the various embodiments of the present invention as discussed above with reference to FIGS. 2-5 all have data hold time requirements that are a function of the duty cycle of clock signal CLK shown at node 101. More specifically, the data signals DATAN at node 103 must be held at the desired level for the duration of the time when clock signal CLK is high. If DATAN changes state(s) during the interval when CLK is high, then the state change will propagate through to the output Q. The present inventors has also noted that it is desirable in some register applications to provide embodiments of the present invention that minimize hold time requirements for DATAN. Accordingly, a pulsed clock embodiment of the present invention will now be discussed with reference to FIG. 6, wherein the embodiment is configured to minimize data hold time.

Figure 6:
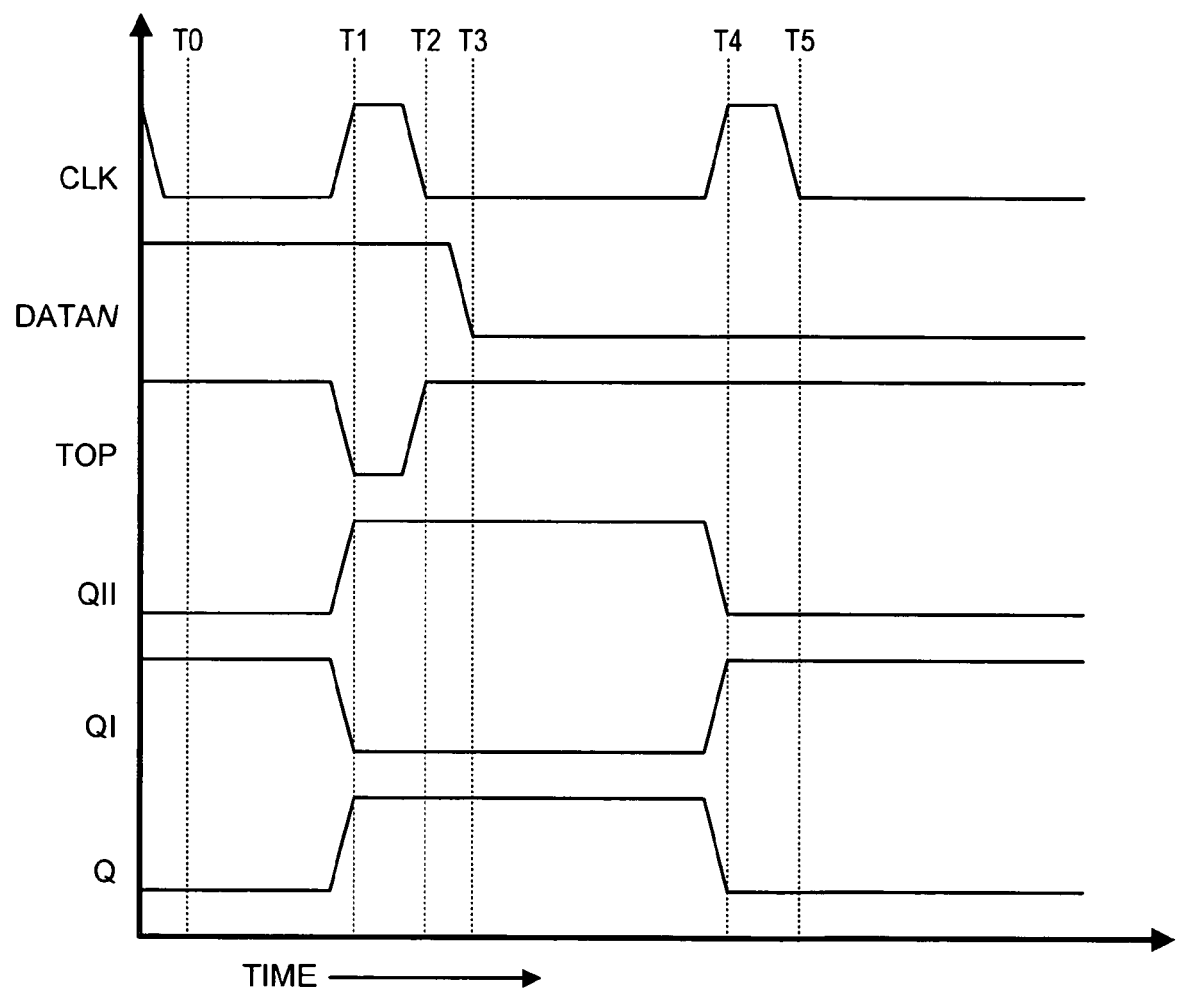
FIG. 6 is a timing diagram illustrating operation of the non-inverting domino register of FIGS. 1, 3, 4 and 5 according to a pulsed clock embodiment that is preferred to minimize hold time.

Turning to FIG. 6, a timing diagram 600 is presented illustrating operation of the non-inverting domino register of FIGS. 1, 3, 4 and 5 according to a pulsed clock embodiment that is preferred to minimize hold time. As discussed above with reference to FIG. 2, the CLK, DATAN, TOP, QII, QI and Q signals are plotted versus time. The relative transitions times are estimated and delays are ignored. The DATAN signal is shown as a single signal representing the collective set of N DATA signals. The DATAN signal is shown asserted high for when the collective state of the data signals causes the evaluation logic 104 to evaluate thereby pulling the TOP signal low, and is shown asserted low for when the evaluation logic 104 fails to evaluate, which keeps the TOP signal high. At time T0 when the CLK signal is initially low, N2 is turned off and P1 is turned on, so that the domino stage pre-charges the TOP signal high. The TOP signal is pre-charged high in preparation for evaluation of the DATAN signal by the evaluation logic 104 upon the rising edge of CLK, where the DATAN signal is initially high. The pre-charged TOP signal turns on N4 and N6. The QII signal remains at its former state (shown initially in a low logic state) and is held there by the keeper circuit 109. The QI signal is initially high turning on N5, so that the Q output signal is initially pulled low via the N5 and N6 devices.

At time T1 the CLK signal goes high, which causes the TOP signal to discharge low since the DATAN signal is high. In particular, N2 is turned on and the evaluation logic 104 evaluates pulling TOP low via N2 to ground. The QII signal is pulled high via P2 and the Q output signal is pulled high via P4. The QII and Q signals are both pulled high at about the same time T1, and the QI signal is pulled low by the inverter 109A. The inverted state of the QI signal at the output of the keeper circuit 109 drives the devices P3 and N5. When QI is high, P3 is off and N5 is on; and when QI is low, P3 is on and N5 is off. At subsequent time T2 when the CLK signal next goes low, the TOP signal is once again pre-charged high. P2 and N3 are turned off so that node 107 is not driven to either state. The respective states of the QII and QI signals remain unchanged, however, via operation of the keeper circuit 109, so that the Q and QII signals remain high and the QI signal remains low throughout the remainder of the half cycle of CLK.

The DATAN is shown going low at time T3 while the CLK signal is still low, and the CLK signal is next asserted high at time T4 while the DATAN signal is low. The evaluation logic 104 fails to evaluate, so that TOP remains high while CLK is high. The CLK and TOP signals turn on devices N3 and N4, respectively, so that the QII signal is asserted low at about time T4, and the QI signal is consequently pulled high by the inverter 109A. The TOP signal being high keeps N6 on. The QI signal turns N5 on and P3 off, so that the Q signal is pulled low via N5 and N6. The CLK signal next goes low at time T5 pulling TOP high again. The respective states of the QII and QI signals remain unchanged via operation of the keeper circuit 109. The Q signal remains low throughout the remainder of the cycle of CLK since QI keeps N5 on and TOP keeps N6 on.

The Q signal transitions from low to high relatively quickly in response to a rising edge of the CLK signal when the evaluation logic 104 evaluates discharging the TOP signal low. There is a negligible delay through devices N2 and P4 causing the output transition. The Q signal transitions from high to low after a negligible delay through devices N3, N5 and the inverter 109A in response to a rising edge of the CLK signal when the evaluation logic 104 fails to evaluate leaving the TOP signal high. The delay through the inverter 109A is minimized by being implemented as a relatively small device (with minimal capacitance) since it does not need to have the size nor perform the function of a buffer. It is appreciated by those of ordinary skill in the art that transitions of the output Q signal of the non-inverting domino register 100 are very fast in response to transitions of the CLK signal. If a non-inverting output is necessary or otherwise desired, the non-inverting domino register 100 provides superior data-to-output speed compared to conventional designs among other benefits and advantages. The non-inverting domino register 100 may be converted to an inverting domino register simply by adding an output inverter/buffer (not shown).

It is noted that the only difference between the timing diagram of FIG. 2 and the timing diagram of FIG. 6 is that node 103 of the non-inverting domino registers of FIGS. 1, 3, 4, and 5 are each coupled to a pulsed clock signal CLK rather than being coupled to an approximately symmetric clock signal CLK. Accordingly, the hold time requirement for data signal DATAN is reduced significantly over the embodiments discussed with reference to FIG. 2. In one embodiment, the duty cycle of the pulsed clock signal CLK is less than or equal to 10 percent. In comparing the embodiments of FIGS. 2 and 6, it is noted that the time from T1 (when CLK goes high) until T3 (when the state of DATAN is allowed to change) is markedly less than the comparable period of FIG. 2. Such an embodiment of the present invention is preferred for minimizing hold time.

It is additionally noted that since the state of DATAN is allowed to propagate through to output Q when CLK is high, the configurations discussed with reference to FIGS. 1, 3, 4, and 5 can also be embodied as N-domino latch embodiments when node 101 is coupled to an approximately symmetric latch clock CLK and where node 103 receives latch data DATAN. The latch data DATAN may be provided by a preceding domino circuit for which a latching function is desired. The circuits of FIGS. 1, 3, 4, and 5 are advantageous when used as N-domino latch embodiments because of an accelerated discharge path through node 105 to the output signal Q, thus allowing for more domino circuits in series to precede node 103 than has heretofore been provided for. The N-domino latch embodiments will now be discussed with reference to FIG. 7.

Figure 7:
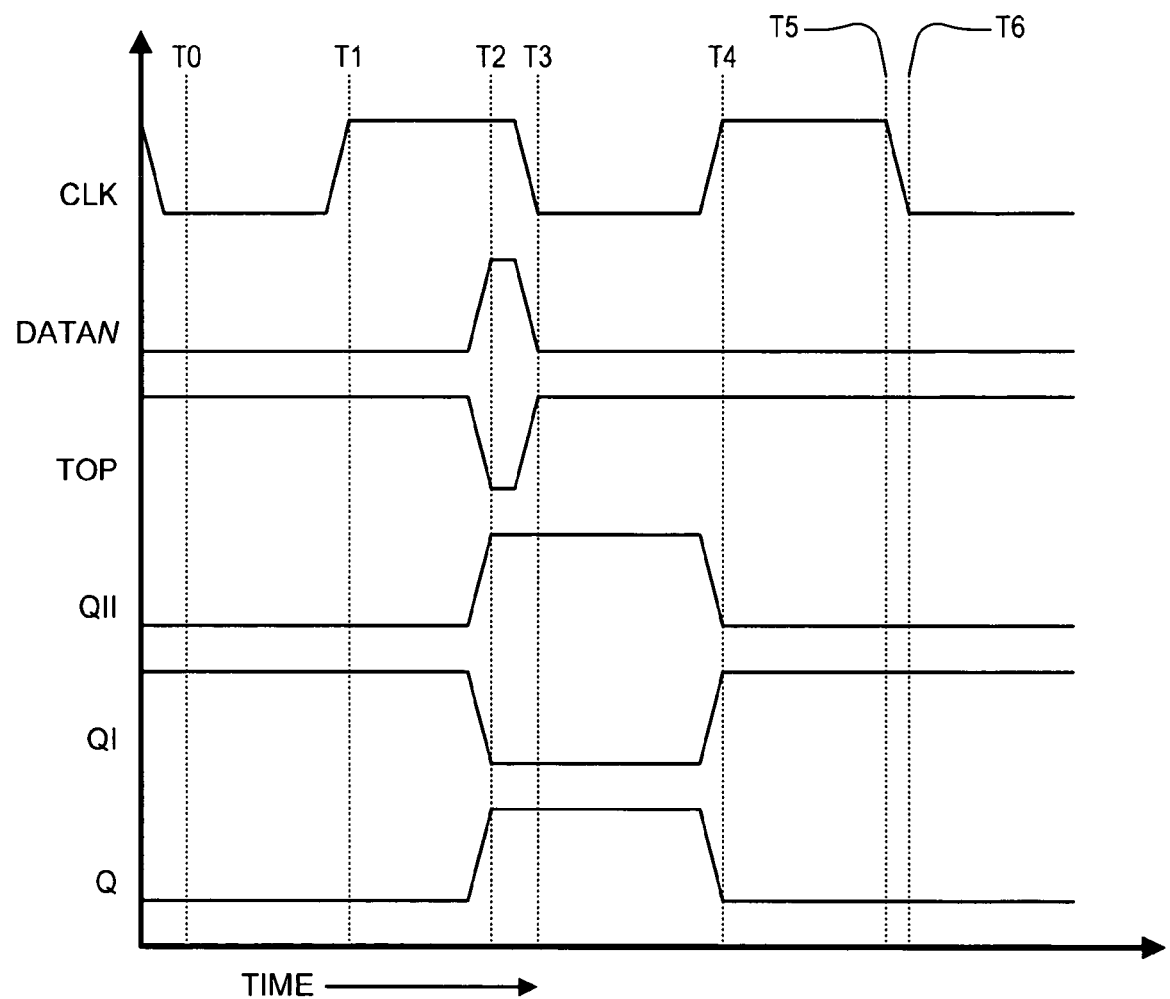
FIG. 7 is a timing diagram illustrating operation of an N-domino latch of FIGS. 1, 3, 4 and 5.

Turning to FIG. 7, a timing diagram is presented illustrating N-domino latch embodiments of the present invention. To employ the circuits of FIGS. 1, 3, 4, and 5 as N-domino latch embodiments, it is desirable to couple node 101 to an approximately symmetric latch clock signal CLK. In one embodiment, the latch clock signal CLK exhibits from a 40 percent to a 60 percent duty cycle. By way of overview, it is noted that during the period when CLK is high, an evaluation window is opened where DATAN is allowed to change and the output Q follows DATAN. But when CLK goes low, the state of DATAN is latched until CLK goes back high. Hence, at time T0, CLK is low and TOP is pre-charged. The previous state (i.e., the state prior to CLK going low) of DATAN is latched through signals QII, QI, and through to the output Q. At time TI, CLK goes back high, opening up a window in which the state of DATAN is allowed to propagate though to the output Q. Since DATAN is low, the output Q remains low. At time T2, DATAN goes high causing signal TOP to discharge, thus turning on P2 and causing the output Q to go high. But at time T3, CLK goes back low, closing the evaluation window and latching the state of DATAN, thus keeping Q high during this period. DATAN also goes back low at T3, reflecting the state of a preceding domino stage whose output is coupled to node 803. TOP precharges at time T3, setting up for the next evaluation window when CLK goes high at time T4. Since DATAN is low at time T4, TOP does not discharge. Thus at time T4, N3 and N4 are on, driving QII low and QI high. Because both QI and TOP are high at T4, Q is driven low. At time T5, because DATAN is still low (i.e., the preceding domino stage did not evaluate), TOP remains high and the low state remains at the output Q. At time T6, CLK goes back low, latching in the state of DATAN at the output Q during the period when CLK is low.

One skilled in the art will also appreciate that because DATAN generally goes back low when CLK goes low, device N2 can be removed from the circuit in an N-domino latch embodiment, which increases the speed of the circuit.

Figure 8:
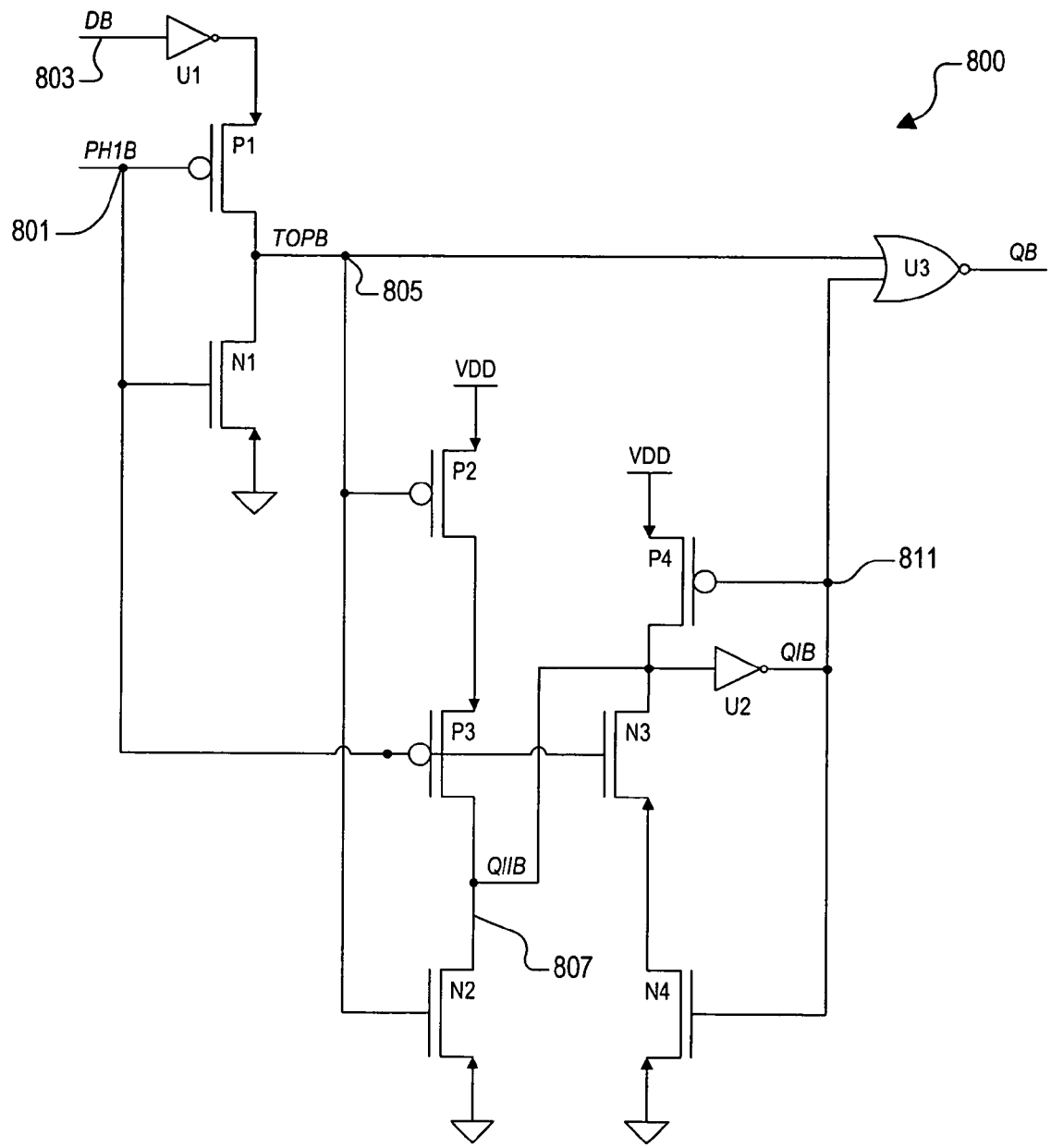
FIG. 8 is a schematic diagram of a P-domino circuit according to another exemplary embodiment of the present invention.

Now referring to FIG. 8, a schematic diagram is presented of a P-domino circuit 800 according to the present invention. The P-domino circuit 800 may be employed as either a latch or a register exhibiting advantages over the prior art as will be described in detail with reference to the timing diagrams of FIGS. 9 and 10. The present inventors have also recognized the need to solve the problem of slow clock-to-output times on P-domino output latches and registers. They have therefore developed a P-domino output circuit 800 that may be employed as either a latch or a register, based upon the type of clock signal and data inputs to which the P-domino circuit 800 is coupled.

Configuration and operation of the P-domino circuit 800 is similar to operation of the N-domino circuit embodiments described above with reference to FIGS. 1-7, except that many of the signals and signal states are inverted as further described below. The P-domino circuit 800 includes three stages, including an evaluation stage, a latching stage, and an output stage. The evaluation stage is formed by a P-channel device P1, an N-channel device N1 and an inverter U1. The latching stage is formed by P-channel devices P2 and P3 and an N-channel device N2 coupled in a stack configuration. The output stage is formed by a P-channel device P4, N-channel devices N3 and N4, inverter U2, and a two-input NOR gate U3. A clock or phase signal PH1B is provided via node 801 to the gates of P1, N1, P3 and N3. The source of N1 is coupled to ground (relative to a source voltage VDD) and its drain is coupled to a pre-charge node 805 developing a pre-charge signal referred to as TOPB. The drain of P1 is coupled to node 805 and its source is coupled to the output of the inverter U1, which has its input coupled to a node 803 providing a data signal DB to the input of the inverter U1.

The P1 and N1 devices form a complementary pair of evaluation devices with the inverter U1 forming evaluation logic for evaluating the data signal DB. One skilled in the art will appreciate that the input evaluation device U1 can be replaced with more complex P-logic configured to pull the source of P1 high when one or more data inputs DB evaluate true (in which case the node 803 comprises a set of nodes providing corresponding data signals to more complex evaluation logic). A single data input DB and a corresponding evaluation logic gate U1 are shown throughout the present disclosure for purposes of simplicity of explanation without departing from the spirit and scope of the present invention. Furthermore, as in the N-domino embodiments of FIGS. 1 and 4, the inverter U1 (or more complex complementary CMOS evaluation logic may be interchanged in cascade circuit position with device P1 to allow for more complex complementary evaluation logic configurations. In such configurations, P1's source would be coupled to source voltage VDD. Furthermore, one skilled in the art will appreciate that since the function U1 (or more complex evaluation logic) is to rapidly transition signal TOPB from its pre-charged low level to a high level, one embodiment of the present invention employs ratioed P and N devices (strong P devices and weak N devices), resulting in faster operation. Thus, when U1 "evaluates," it causes signal TOPB to transition from its pre-charged low state to a high state. When U1 "fails to evaluate," TOPB remains at its pre-charged low state.

Node 805 providing the TOPB signal is coupled to the gates of devices P2 and N2 and to one input of the NOR gate U3. The source of P2 is coupled to VDD and its drain is coupled to the source of P3, having its drain coupled to a node 807 developing a first intermediate output signal QIIB. The drain of N2 is coupled to node 807 and its source is coupled to ground. The source of P4 is coupled to VDD and its drain is coupled to the drain of N3, having its source coupled to the drain of N4 at the node 807. The source of N4 is coupled to ground. Node 807 is coupled to the node formed by the drains of P4 and N4 and to the input of the inverter U2, where the output of U2 is coupled to node 811 developing a second intermediate output signal QIB. The QIB signal is driven to the opposite logic state as the QIIB signal after one gate delay through the inverter U2. Node 811 is coupled to the gates of P4 and N4 and to the other input of the NOR gate U3. The output the NOR gate U3 provides the output QB signal.

Figure 9:
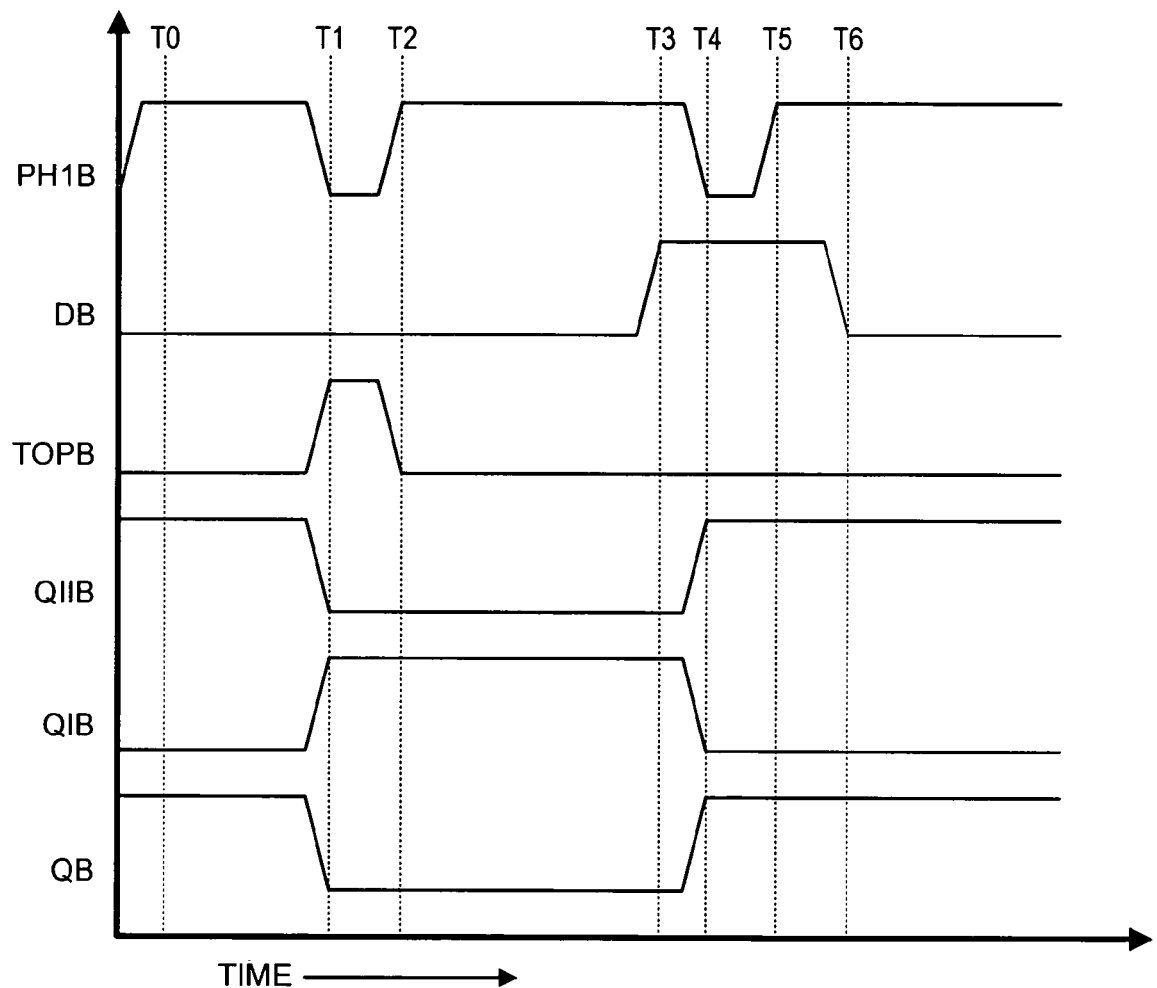
FIG. 9 is a timing diagram illustrating operation of the P-domino circuit of FIG. 8 when employed as a P-domino register embodiment of the present invention.

Now turning to FIG. 9, a timing diagram is presented illustrating operation of the P-domino circuit 800 when employed as a P-domino latch in which the signals PH1B, DB, TOPB, QIIB, QIB, and QB are plotted versus time. Several simplifications are made in the timing diagrams. The delays through each device or component (N-channel devices, P-channel devices, logic gates, multiplexers, etc.) are shown to be equal since they are roughly equivalent to each other, and the rise and fall times are also shown to be equal, since these times are also roughly equivalent. The timing diagram illustrates two PH1B cycles. As described above, to employ the P-domino circuit 800 as a P-domino register, it is desirable to couple node 801 to an pulsed clock signal PH1B. In one embodiment, PH1B has a duty cycle less than or equal to 10 percent.

At an initial time T0, the QIIB signal is initially high and is to be asserted low in response to the PH1B signal going low since the DB signal is low. Also at time T0, the PH1B signal is initially high while the QIB signal is low. Since PH1B is high, N1 is turned on and TOPB is "pre-charged" low so that P2 and N3 are both turned on. Since QIB and TOPB are both low, the QB signal at the output of the NOR gate U3 is initially high. While PH1B is high and. QIB is low, N4 is off, N3 is on and P4 is on. In this case, therefore, P4 and N3 are both on providing a "high" state keeper path for the node 807 to VDD which keeps the QIIB signal high.

The DB signal, representing one or more input data operands, is shown initially low which causes the inverter U1 to pull the source of P1 high. When the PH1B signal goes low at time T1 while DB is low, P1 is turned on. When P1 is turned on, the TOPB signal is pulled high via P1. TOPB going high causes the NOR gate U3 to assert QB low. Also, TOPB going high at time T1 turns N2 on so that the QIIB signal is pulled low. In response to the QIIB signal going low, the inverter U2 pulls the QIB signal high. QIB going high turns N4 on and P4 off. The QIB signal being high effectively latches the QB output signal low for the remainder of the PH1B cycle.

At a time T2 when PH1B next goes high, TOPB is once again pre-charged low through N1. The QIB signal being high keeps N4 on which keeps QIIB low and QIB high to maintain the state of the QB output signal while TOPB goes low. The TOPB signal going low turns P2 back on, but since the PH1B signal is high, P3 is off so that the QIIB signal is not pulled high.

The DB signal goes high at time T3 to set up for the next edge of PH1B so that the inverter U1 pulls the source of P1 low. The PH1B signal next goes low at time T4 turning P1 on. Since DB is still high and the source of P1 is low, TOPB remains low at time T4. The PH1B signal going low turns N3 off and P3 on. Since N2 remains off and P2 and P3 are both turned on, the QIIB signal is pulled high. The inverter U2 pulls QIB low in response to QIIB going high. Since QIB and TOPB are now both low, the NOR gate U3 pulls QB high.

The P-domino register embodiment of the circuit 800 of FIG. 8 is well-suited for critical timing paths upon "evaluate" conditions because only two stages (U1 and U3) of gate delay are presented during an evaluation period (when PH1B is low) for data-to-output time. By coupling node 801 to a pulsed clock source PH1B as described herein, hold time requirements for the data signal DB coupled to node 803 are minimized. For example, in the timing diagram of FIG. 9, DB can change state any time following time T2 (or time T5) because the state of DB is registered at QB until the evaluation interval of PH1.

Since the state of DB is allowed to propagate through to output QB when PH1B is low, the P-domino circuit 800 can also be embodied as a P-domino latch by coupling node 801 to an approximately symmetric latch clock signal PH1B and by coupling node 803 to latch data DB. The latch data DB may be provided by a preceding domino circuit for which a latching function is desired. The circuit 800 of FIG. 8 is advantageous when used as a P-domino latch embodiment because of an accelerated "discharge" path through node 805 to the output signal QB, thus allowing for more domino circuits in series to precede node 803 than has heretofore been provided for. The P-domino latch embodiment will now be discussed with reference to FIG. 10.

Figure 10:
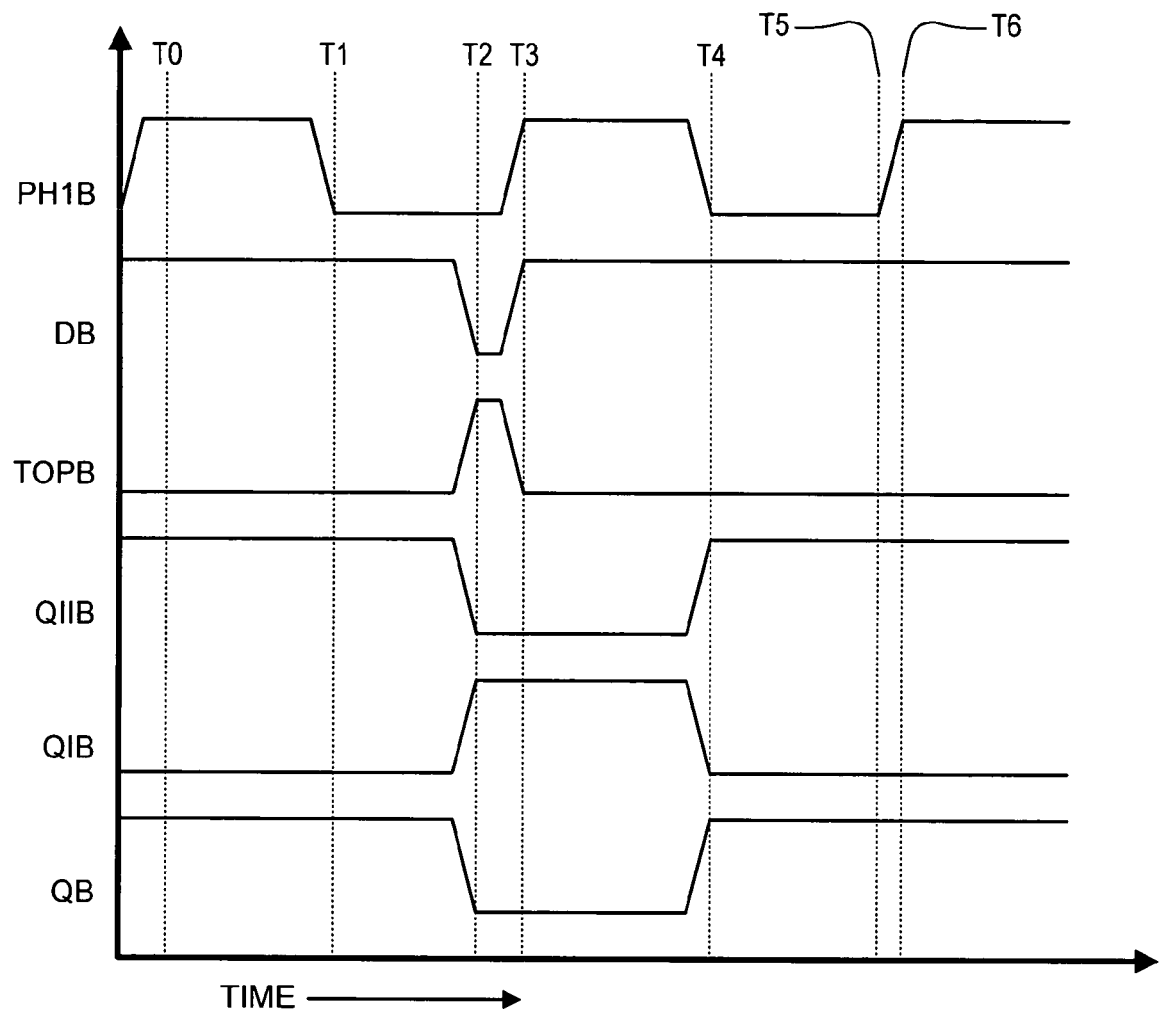
FIG. 10 is a timing diagram illustrating operation of the P-domino circuit of FIG. 8 when employed as a P-domino latch embodiment of the present invention.

Turning to FIG. 10, a timing diagram is presented illustrating a P-domino latch embodiment of the present invention. To employ the circuit 800 of FIG. 8 as a P-domino latch, it is desirable to couple node 801 to an approximately symmetric latch clock signal PH1B. In one embodiment, the latch clock signal PH1B exhibits from a 40 percent to a 60 percent duty cycle. By way of overview, it is noted that during the period when PH1B is low, an evaluation window is opened where DB is allowed to change and the output QB follows DB. But when PH1B goes high, the state of DB is latched until PH1B goes back low. Hence, at time T0, PH1B is high and TOPB is pre-charged low. The previous state (i.e., the state prior to PH1B going low) of DB is latched through signals QIIB, QIB, and to the output QB. At time TI, PH1B goes back low, opening up a window in which the state of DB is allowed to propagate though to the output QB. Since DB is high during this window, the output QB remains high. At time T2, DB goes low causing signal TOPB to "discharge" to a high level, thus turning on N2 and causing the output QB to go low. But at time T3, PH1B goes back high, closing the evaluation window and latching the state of DB, thus keeping QB low during this half-cycle of PH1B. DB also goes back high at T3, reflecting the state of a preceding domino stage whose output is coupled to node 803. TOPB precharges low at time T3, setting up for the next evaluation window when PH1B goes low at time T4. Since DB is high at time T4, TOP does not discharge. Thus at time T4, P2 and P3 are on, driving QIIB high and QIB low. Because both QIB and TOPB are low at T4, QB is driven high. At time T5, because DB is still high (i.e., the preceding domino stage did not evaluate such that DB went low), TOPB remains low and the high state remains at the output QB. At time T6, PH1B goes back high, latching in the state of DB at the output QB during the period when PH1B is low.

One skilled in the art will also appreciate that because DB generally goes back high when PH1B goes high, device P1 can be eliminated from the circuit 800 in a P-domino latch embodiment, which increases the speed of the circuit 800.

Although the present invention has been described in considerable detail with reference to certain preferred versions thereof, other versions and variations are possible and contemplated. Moreover, although the present disclosure contemplates one implementation using MOS type devices, including CMOS devices and the like, such as, for example, NMOS and PMOS transistors, it may also be applied in a similar manner to different or analogous types of technologies and topologies, such as bipolar devices or the like. Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. An N-domino latch, comprising:
   a domino stage, coupled to an approximately symmetric clock signal, and for evaluating a logic function according to the states of at least one data signal and said approximately symmetric clock signal, wherein said domino stage pre-charges a pre-charged node high when said approximately symmetric clock signal is low, and discharges said pre-charged node to a low state if said logic function evaluates when said approximately symmetric clock signal is high, and keeps said pre-charged node high if said logic function fails to evaluate when said approximately symmetric clock signal is high, wherein a latching state of said at least one data signal is provided to said domino stage when said approximately symmetric clock signal is high;

a write stage, coupled to said domino stage and responsive to said approximately symmetric clock signal, which pulls a first preliminary output node high if said pre-charged node goes low and which pulls said first preliminary output node low if said pre-charged node stays high;

an inverter having an input coupled to said first preliminary output node and an output coupled to a second preliminary output node;

a high keeper path which keeps said first preliminary output node high when enabled, wherein said higher keeper path is enabled when said approximately symmetric clock signal and said second preliminary output node are both low and which is otherwise disabled;

a low keeper path which keeps said first preliminary output node low when enabled, wherein said low keeper path is enabled when said second preliminary output node and said pre-charged node are both high and which is otherwise disabled; and an output stage which provides an output signal based on states of said pre-charged node and said second preliminary output node.

2. The N-domino latch as recited in claim 1, wherein said domino stage comprises:
 a P-channel device having a gate coupled to said approximately symmetric clock signal and a drain and source coupled between a source voltage and said pre-charged node;
 evaluation logic coupled to said pre-charged node; and
 an N-channel device having a gate coupled to said approximately symmetric clock signal and a drain and source coupled between said evaluation logic and ground.

3. The N-domino latch as recited in claim 1, wherein said domino stage comprises:
 a P-channel device having a gate coupled to said approximately symmetric clock signal, and a drain and source coupled between a source voltage and said pre-charged node;
 an N-channel device having a gate coupled to said approximately symmetric clock signal, a drain coupled to said pre-charged node and a source; and
 evaluation logic coupled between ground and said source of said N-channel device.

4. The N-domino latch as recited in claim 3, wherein said evaluation logic comprises complementary metal-oxide semiconductor logic.

5. The N-domino latch as recited in claim 1, wherein said write stage comprises:
 a first P-channel device having a gate coupled to said pre-charged node, and a drain and source coupled between a source voltage and said first preliminary output node;
 a first N-channel device having a gate receiving said approximately symmetric clock signal, a drain coupled to said first preliminary output node and a source; and
 a second N-channel device having a gate coupled to said pre-charged node, a drain coupled to said source of said first N-channel device and a source coupled to ground.

6. The N-domino latch as recited in claim 5, wherein said high keeper path comprises:
 a second P-channel device having a gate coupled to said second preliminary output node, a source coupled to said source voltage and a drain; and
 a third P-channel device having a gate receiving said approximately symmetric clock signal, and a drain and source coupled between said drain of said second P-channel device and said first preliminary output node.

7. The N-domino latch as recited in claim 6, wherein said low keeper path comprises said second N-channel device and a third N-channel device having a gate coupled to said second preliminary output node, and a drain and source coupled between said first preliminary output node and said drain of said second N-channel device.

8. The N-domino latch as recited in claim 1, wherein said output stage comprises a NAND gate.

9. The N-domino latch as recited in claim 1, wherein said domino stage, said write stage, said inverter, said high and low keeper paths and said output logic are integrated using a scaled 90 nanometer silicon-on-insulator process.

10. An N-domino latching circuit, comprising:
 an evaluation circuit, configured to receive a symmetric clock signal provided from a source therefrom, and configured to pre-charge a first node high while said symmetric clock signal is low, and configured to evaluate a logic function to control a state of said first node when said symmetric clock signal goes high, wherein said logic function is evaluated based upon one or more data signals that are to be evaluated when said symmetric clock signal is high and that are to be latched when said symmetric clock signal is low;
 a write circuit, coupled to said first node and receiving said symmetric clock signal, that drives a second node high if said first node is low and that drives the second node low if said first node stays high when said symmetric clock signal goes high;
 an inverter having an input coupled to said second node and an output coupled to a third node;
 a keeper circuit, coupled to said second and third nodes and said write circuit, that keeps said second node high while said third node and symmetric clock signals are both low and that keeps said second node low while said third node and first node are both high; and
 an output circuit providing an output signal based on states of said first and third nodes.

11. The N-domino latching circuit as recited in claim 10, wherein said evaluation circuit comprises:
 a P-channel device, coupled to said first node and receiving said symmetric clock signal, that pre-charges said first node high while said symmetric clock signal is low;
 a logic circuit, coupled to said first node, that evaluates said logic function based on at least one input data signal; and
 an N-channel device, coupled between said logic circuit and ground and receiving said symmetric clock signal;
 wherein said P-channel device and said N-channel device collectively enable said logic circuit to control said state of said first node when said symmetric clock signal goes high.

12. The N-domino latching circuit as recited in claim 10, wherein said evaluation circuit comprises:
 a P-channel device, coupled to said first node and receiving said symmetric clock signal, that pre-charges said first node high while said symmetric clock signal is low;
 an N-channel device, coupled to said first node and receiving said symmetric clock signal; and a logic circuit, coupled between said N-channel device and ground, that evaluates said logic function based on said one or more data signals;

wherein said P-channel device and said N-channel device collectively enable said logic circuit to control said state of said first node when said symmetric clock signal goes high.

13. The N-domino latching circuit as recited in claim 12, wherein said logic circuit comprises complementary metal-oxide semiconductor devices.

14. The N-domino latching circuit as recited in claim 10, wherein said write circuit comprises:

a first P-channel device, coupled to said first and second nodes, that pulls said second node high if said first node goes low;

a first N-channel device, coupled to said second node and receiving said symmetric clock signal; and a second N-channel device, coupled to said first N-channel device and to said first node;

wherein said first and second N-channel devices collectively pull said second node low if said first node remains high in response to said symmetric clock signal going high.

15. The N-domino latching circuit as recited in claim 14, wherein said keeper circuit comprises:

second and third P-channel devices, coupled together and to said second and third nodes, that collectively form a high state keeper path which is enabled to pull said second node high when said third node and said clock signal are both low and which is otherwise disabled; and a third N-channel device, coupled to said second and third nodes and to said second N-channel device, wherein said second and third N-channel devices collectively form a low state keeper path which is enabled to pull said second node low when said first and third nodes are both high and which is otherwise disabled.

16. The N-domino latching circuit as recited in claim 10, wherein said output circuit comprises a NAND gate.

17. The N-domino latching circuit as recited in claim 10, wherein said evaluation circuit, said write circuit, said inverter, said keeper circuit and said output logic are integrated using a scaled 90 nanometer silicon-on-insulator process.

18. A non-inverting N-domino latch, comprising:

a first P-channel device having a gate coupled to an approximately symmetric clock signal and a drain and source coupled between a source voltage and a pre-charged node;

a first N-channel device having a gate receiving said approximately symmetric clock signal, a drain coupled to said pre-charged node and a source;

evaluation logic, coupled between said source of said N-channel device and ground and comprising complementary metal-oxide semiconductor logic, that evaluates a logic function based on at least one input data signal, wherein said at least one input data signal is to be evaluated when said approximately symmetric clock signal is high and is to be latched when said approximately symmetric clock signal goes low;

a write stage driving a first preliminary output node, said write stage comprising a first pull-up device and a first pull-down device both responsive to said pre-charged node, and a second pull-down device responsive to said approximately symmetric clock signal;

a keeper circuit having an input coupled to said first preliminary output node and an output that drives a second preliminary output node; and an output stage driving an output node, said output stage comprising a second pull-up device and a third pull-down device both responsive to said pre-charged node and a third pull-up device and a fourth pull-down device both responsive to said second preliminary output node.

19. The non-inverting N-domino latch as recited in claim 18, wherein said write stage comprises:

a second P-channel device having a gate coupled to said pre-charged node and a drain and source coupled between said source voltage and said first preliminary output node;

a second N-channel device having a gate receiving said clock signal, a drain coupled to said first preliminary output node and a source; and a third N-channel device having a gate coupled to said pre-charged node, a drain coupled to said source of said second N-channel device and a source coupled to ground.

20. The non-inverting N-domino latch as recited in claim 19, wherein said keeper circuit comprises a pair of inverters cross-coupled between said first and second preliminary output nodes.

21. The non-inverting N-domino latch as recited in claim 18, wherein said output stage comprises:

a second P-channel device having a gate coupled to said pre-charged node and a drain and source coupled between a source voltage and said output node;

a third P-channel device having a gate coupled to said second preliminary output node, a source coupled to said source voltage and a drain coupled to said output node;

a second N-channel device having a gate coupled to said second preliminary output node, a drain coupled to said output node and a source; and a third N-channel device having a gate coupled to said pre-charged node, a drain coupled to said source of said second N-channel device and a source coupled to ground.

22. A method of latching one or more input data signals, comprising:

pre-charging a first node high while an approximately symmetric clock signal is low;

when the approximately symmetric clock signal is high, evaluating a logic function based upon the one or more input data signals to control the state of the first node;

controlling the state of a second node with the state of the first node when the approximately symmetric clock signal is high;

defining the state of a third node as the inverted state of the second node;

enabling a low state keeper path to keep the state of the second node low when the first and third nodes are both high and otherwise disabling the low state keeper path;

enabling a high state keeper path to keep the state of the second node high when the approximately symmetric clock signal and the third node are both low and otherwise disabling the high state keeper path; and when the approximately symmetric clock signal is low, latching the state of an output node based on the states of the first and third nodes.

23. The method of claim 22, wherein said evaluating a logic function to control the state of the first node comprises pulling the first node low when the logic function evaluates and keeping the first node high when the logic function fails to evaluate.

24. The method of claim 23, wherein said controlling the state of a second node with the state of the first node comprises pulling the second node high if the first node is pulled low and pulling the second node low if the first node remains high when the approximately symmetric clock signal goes high.

25. The method of claim 22, wherein said enabling a low state keeper path and otherwise disabling the low state keeper path comprises controlling first and second series-coupled pull-down devices with the first and third nodes, respectively.

26. The method of claim 22, wherein said enabling a high state keeper path and otherwise disabling the high state keeper path comprises controlling first and second series-coupled pull-up devices with the approximately symmetric clock signal and the third node, respectively.

27. The method of claim 22, wherein said determining the state of an output node comprises logically combining the states of the first and third nodes with a NAND function.

* * * * *